United States Patent [19]
Sawaragi

[11] Patent Number: 4,710,639
[45] Date of Patent: Dec. 1, 1987

[54] ION BEAM LITHOGRAPHY SYSTEM

[75] Inventor: Hiroshi Sawaragi, Tokyo, Japan

[73] Assignee: Jeol Ltd., Tokyo, Japan

[21] Appl. No.: 852,185

[22] Filed: Apr. 15, 1986

[30] Foreign Application Priority Data

Apr. 18, 1985 [JP] Japan ................................. 60-83355

[51] Int. Cl.⁴ .......................................... H01J 37/302
[52] U.S. Cl. .................................. 250/492.2; 250/398
[58] Field of Search ................. 250/492.21, 492.2, 398

[56] References Cited

U.S. PATENT DOCUMENTS 3,889,115  6/1975  Tamura et al. ...................... 250/307
4,218,621  8/1980  Nakasuji et al. .................. 250/492.2

Primary Examiner—Craig E. Church
Assistant Examiner—Jack I. Berman
Attorney, Agent, or Firm—Webb, Burden, Robinson & Webb

[57] ABSTRACT

When ions are implanted into desired locations on a material surface using a focused ion beam system, it is necessary to incline the direction of the implantation at about 7° to a line normal to the material surface. The system according to the present invention uses a deflector consisting of deflecting elements of two stages to deflect an ion beam, for effecting such an inclination. The beam is deflected in a given direction by the deflecting element of the first stage, and then it is deflected in the opposite direction by the deflecting element of the second stage. Since chromatic aberrations of the beam caused by the deflecting elements of the two stages cancel each other, defocusing of the beam on the material due to energy dispersion is suppressed.

3 Claims, 5 Drawing Figures

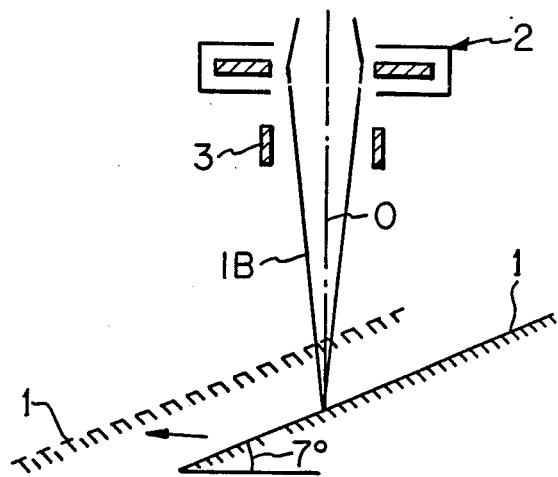
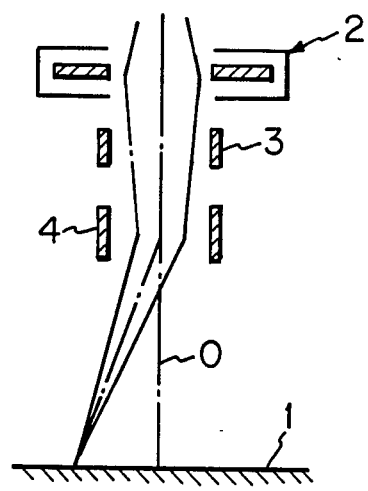
Fig. 1 PRIOR ART
Fig. 2
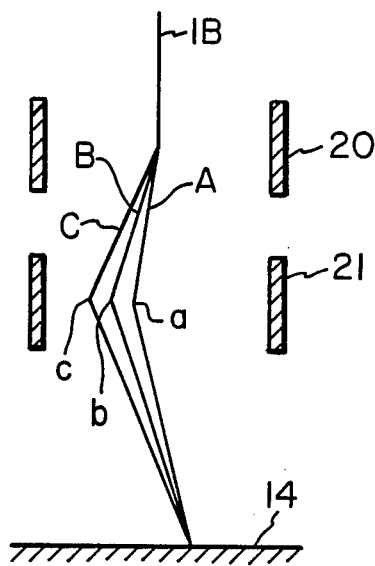
Fig. 4
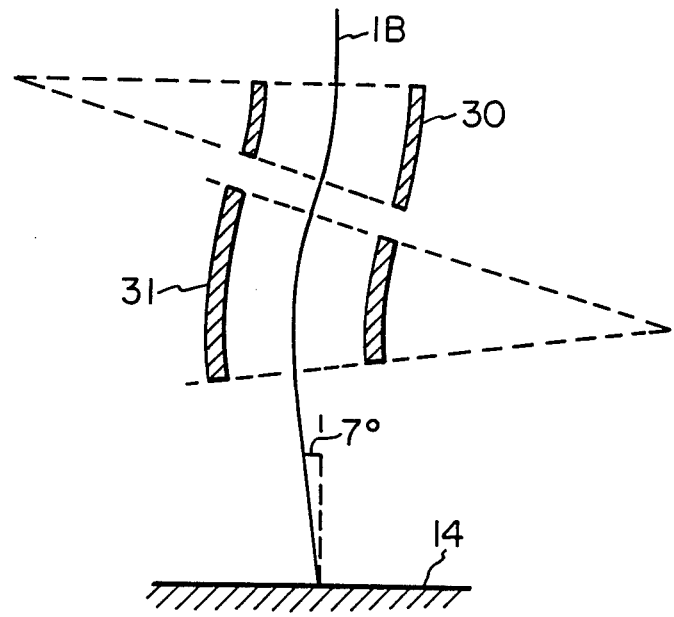
Fig. 5

ION BEAM LITHOGRAPHY SYSTEM

BACKGROUND OF THE INVENTION

The present invention relates to a system that directs a finely focused ion beam onto a substrate to be patterned and moves the position at which the beam impinges on the substrate in order to write a desired pattern on the substrate.

A system which is capable of focusing ions into a fine beam and deflecting the beam can be used for an ion implantation system having no mask. (A focused ion beam producing system used in another application is described in U.S. Pat. No. 3,889,115.) This ion implantation is achieved by causing an ion source to produce doping ions, focusing these ions into a beam, and directing the beam to impinge upon a substrate material in a desired pattern. The substrate material may consist of silicon, gallium arsenide, or another material. Since the position at which the beam falls on the substrate can be moved by deflecting the beam, any desired pattern can be drawn on the substrate by controlling the deflecting of the beam according to the desired pattern. As a result, the doping (impurity) ions are implanted into desired locations on the substrate.

When ions are being implanted into a crystalline semiconductor substrate material, if the ions find entry into an open space between rows of atoms channeling starts to occur. Then, the impurity ions penetrate deep into the open space (channel). Accordingly, it is required that the ions be inserted off the center of the channel, depending on the purpose. Unfortunately, however, such channels frequently run vertically to the surface of the material. Therefore, it has been the common practice to incline the surface of the substrate material at an angle of about 7°, for example, to the direction of the implantation of the beam, or the optical axis of the equiment used.

This prior art equipment is shown in FIG. 1, where a material 1 to be patterned is inclined at an angle to the optical axis 0 of the equipment. Also shown are an objective lens 2 and an electrostatic deflector 3. An ion beam (IB) is finely focused onto the target material 1 by the objective lens 2. The position at which the beam irradiates the target material is varied according to the deflecting voltage supplied to the deflector 3. It is assumed that the beam is brought into focus when the beam falls on the target material surface at a position lying on the optical axis 0. If the beam is then deflected so that the beam falls on the target material surface at another position not lying on the optical axis 0, then the beam is defocused, i.e., the diameter of the beam deteriorates. This defocusing arises from the deflection of the beam and also from the inclination of the material. That is, this undesirable phenomenon stems from the fact that the distance between the starting point of the beam deflection and the irradiated position on the material 1 varies widely according to the deflection of the beam. This requires that the equipment be adjusted to change the feeding voltage of the objective lens 2 in a wide range, whereby the ion beam irradiating the material 1 is maintained in focus, irrespective of the deflection angle. It is very cumbersome, however, to control the voltage of the objective lens in this way, because the deflection must be effected according to both the deflection angle and the inclination angle of the target material. Further, when the target material 1 is moved to the position indicated by the broken line in FIG. 1, the position of the focused beam on the optical axis is shifted. This makes it more difficult to achieve automatic adjustment of focus (dynamic focusing).

In view of the foregoing, the present inventor has already invented an ion beam lithograph system shown in FIG. 2, where a material 1 to be patterned is disposed substantially vertically to the optical axis 0 of the ion beam. A newly introduced deflector 4 deflects the beam at a constant angle so that the beam impinges on the material 1 at a substantially constant incidence angle to prevent the beam from penetrating deep into the target material.

Although the position at which the ion beam strikes the target material 1 is varied by deflecting the beam through the use of the deflector 3, the distance between the starting point of the deflection of the beam and the illuminated position varies only slightly according to the deflection angle of the beam defined by the deflector 3, because the flat surface of the material is disposed substantially vertically to the optical axis 0. Therefore, the focus is automatically adjusted only with respect to the deflection angle. Hence, the objective lens and other elements can be easily controlled.

My aforementioned invention provides an ion beam lithography system that is able to focus the ion beam quite easily. Usually, the energy spread of ions produced from a liquid metal ion source are about 10 eV under the condition of low emission current. Since the ion beam having such an energy speed is deflected, the ion beam is dispersed greatly at the target plane. The deflection chromatic aberrations caused by the deflection increase the diameter of the beam on the surface of the target material, making it impossible to draw a pattern with a beam diameter less than 0.1 $\mu$m.

SUMMARY OF THE INVENTION

It is an object of the invention to provide an ion beam lithography system which can deflect an ion beam with less defocusing while preventing a channeling effect.

It is another object of the present invention to provide an ion beam lithography system which can draw a pattern on a target material with an ion beam directed to the target material in a certain direction not normal to the target material surface while suppressing effects of the dispersion of the beam.

The above and other objects of the invention are achieved by an ion beam lithography system that deflects an ion beam to move the position at which the beam impinges on a target material (substrate) to draw a pattern thereon. The system is characterized by the provision of first and second deflectors. The first deflector acts to deflect the beam at a constant magnitude during the lithographic process to cause the beam to fall on the target material at a selected angle to the material surface that is substantially perpendicular to the optical axis. The second deflector serves to deflect the beam to vary the position at which the beam hits the target material. The first deflector consists of deflecting elements of first and second stages. The beam is deflected in a selected direction by the element of the first stage, and then it is deflected in the opposite direcion by the element of the second stage.

In the ion beam lithography system according to the invention, a target material to be patterned is placed substantially perpendicular to the optical axis. The ion beam is deflected at a constant deflection angle by the first deflector so that the beam impinges on the target material at a substantially constant incidence angle. The position at which the beam impinges on the material is varied by deflecting the beam using the second deflector. Consequently, the distance between the starting point of the deflection of the beam and the irradiated position varies only slightly according to the deflection angle of the beam defined by the second deflector, because the target material surface is placed substantially perpendicular to the optical axis. Hence, the focus can be automatically adjusted simply with respect to the deflection angle. As a result, the objective lens and other elements can be controlled easily. When the deflection angle determined by the second deflector is relatively small, it is not necessary that the focus be automatically adjusted with respect to the deflection angle. The first deflector consists of deflecting elements of first and second stages. The ion beam is deflected in a certain direction by the deflecting element of the first stage, and then it is deflected in the opposite direction by the deflecting element of the second stage. Consequently, the deflection chromatic aberrations caused by the deflecting elements of the two stages cancel each other. The result is that defocusing of the beam caused by the energy dispersion of the beam on the target material can be suppressed. The invention is hereinafter described in greater detail by referring to the accompanying drawings.

BRIEF DESCRIPTION OF THE DRAWINGS

FIG. 1 is a schematic diagram of a conventional focused ion beam lithography system;

FIG. 2 is a schematic diagram for illustrating my already proposed ion beam lithography system on which the present invention is based;

FIG. 4 shows the manner in which an ion beam is deflected; and

FIG. 5 is a schematic representation of another example of ion beam deflector.

DESCRIPTION OF THE PREFERRED EMBODIMENT

Figure 3:
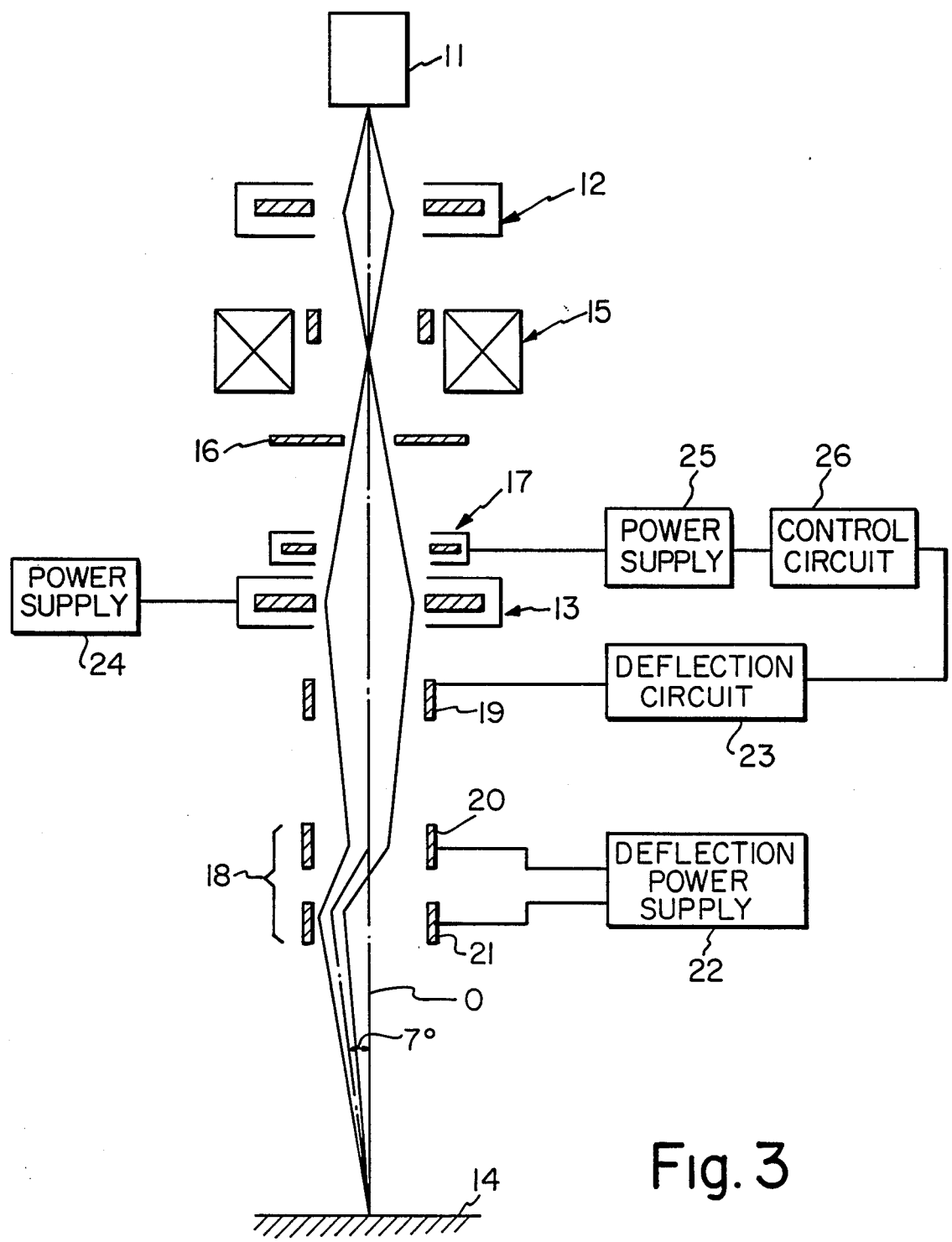
FIG. 3 is a block diagram of a focused ion beam lithography system according to the present invention.

Referring to FIG. 3, there is shown an ion beam lithography system according to the present invention. This system has an ion source 11 for producing an ion beam containing desired doping (impurity) ions. The beam is accelerated and finely focused on a target material 14 to be patterned, such as a silicon wafer, by means of a condenser lens 12 and an objective lens 13. The lenses 12 and 13 are electrostatic lenses of the Einzel type. The target material 14 is so disposed that its surface is perpendicular to the optical axis 0. A Wien filter 15 and an aperture 16 are disposed between the lenses 12 and 13 to extract only the desired doping (impurity) ions. As is well known, the filter 15 is equipped with electrodes and coils for producing mutually perpendicular electric and magnetic fields. The ions other than the desired impurity ions are deflected away from the optical axis 0 by these fields. The diaphragm 16 prevents the ions from traveling toward the target material 14. An auxiliary lens 17 is disposed above the objective lens 13. Disposed between the objective lens 13 and the target material 14 are a first electrostatic deflector 18 and a second electrostatic deflector 19, each of which consists of parallel plate electrodes. The first deflector 18 consists of two electrostatic deflecting plates 20 and 21 which are supplied with voltages of opposite polarities from a deflection power supply 22. A deflection circuit 23 produces a deflection voltage signal according to the pattern to be drawn and supplies it to the second deflector 19. The objective lens 13 and the auxiliary lens 17 are excited by power supplies 24 and 25, respectively. The power supply 25 is controlled by a control circuit 26 receiving a signal that is controlled in response to the deflecting signal from the deflection circuit 23.

In the structure described above, the ion beam falling on the material 14 is deflected by the electrostatic deflecting plates 20 and 21 of the first deflector 18. The beam is always inclined at an angle of, for example, 7° to the optical axis 0 while the beam is directed to the target material 14. This yields the same result as in the case where the surface of the target material 14 is inclined at an angle of 7° to a plane perpendicular to the optical axis of the beam. Thus, the beam hitting the target material is not guided along an open space (channel) between rows of atoms. Consequently, it is unlikely that the ion beam penetrates deep into the material. The signal that is controlled according to the pattern to be drawn to deflect the beam is supplied to the second deflector 19 from the deflection circuit 23, so that the incident position of the beam is varied while the beam is kept at an angle to the material surface. The output signal from the deflection circuit 23 which is controlled according to the deflecting signal is fed to the control circuit 26 that controls the auxiliary lens power supply 25 in such a manner that the compensating voltage supplied from the power supply 25 to the auxiliary lens 17 is controlled. Therefore, the defocusing of the beam on the target material 14 caused by the deflection using the second deflector 19 is compensated for by the auxiliary lens. Consequently, the focus of the beam is automatically adjusted with respect to the deflection angle of the beam. As a result, the beam falling on the target material 14 is maintained in focus, in spite of the moving irradiated position on the material, thus allowing accurate drawing.

The ion beam is deflected according to the voltages applied to the deflecting plates 20 and 21 of the first deflector 18. Since the voltages applied to the plates 20 and 21 have opposite polarities, if the ions impinging on the material have three energies of A (200 KV + 10 V), B (200 KV), and C (200 KV − 10 V), for example, then the beam is dispersed into three positions a, b, c in the center of the deflecting field created by the second stage deflecting plate 21, by the deflection chromatic aberration caused by the deflecting plate 20 of the first stage as shown in FIG. 4. The dispersed ion beams A, B, C are deflected according to the voltage applied to the deflecting plate 21. Since the polarity of the voltage applied to the deflecting plate 21 of the second stage is opposite to the polarity of the voltage applied to the deflecting plate 20 of the first stage, the dispersed beams A, B, C are refocused at one point on the target material 14 by the deflection chromatic aberration acting in the reverse direction. Consequently, defocusing of the beam on the material 14 caused by the deflection chromatic aberration is substantially eliminated. Hence, it is possible to draw pattern with a microscopically thin beam less than 0.1 μm.

As described thus far, in accordance with the invention, the surface of the material to be patterned is placed vertical to the optical axis 0 of the ion beam. The beam is caused to fall on the material while maintained at a constant angle to the surface. Therefore, the focus can be adjusted simply with respect to the deflection angle. As such, dynamic focusing can be quite easily achieved. Where the deflection angle is minute, dynamic focusing is not always necessitated. If the target material 14 is moved, the distance between the starting point of the deflection made by the second deflector and the material remains unchanged and so the focus is not required to be adjusted during the movement of the material. Since the two deflectors are used to incline the irradiating beam at a constant angle, the beam can be free of effect of deflection chromatic aberrations.

It is to be understood that the present invention is not limited to the above embodiment, but rather various changes and modifications may be made thereto. In the above embodiment, defocusing of the ion beam caused by the deflection is compensated for by controlling the feeding voltage of the auxiliary lens. It is also possible to omit such an auxiliary lens and to control the feeding voltage of the objective lens in response to the deflection angle. Further, it is possible to dispose the second deflector 19 above the objective lens 13 to have a longer working distance. In addition, the second deflector can be made up of deflecting elements of two stages to cope with large deflection angles. Where the deflection angle of the ion beam formed by the first deflector is so large that fringing effects of the first deflector cannot be neglected, electrostatic deflection prisms 30 and 31 which are symmetrical with respect to a plane may be used as shown in FIG. 5, instead of the electrostatic deflector in the form of parallel plates.

As described in detail thus far, in accordance with the present invention, the ion beam falling on the target material to be patterned is maintained at an angle to a line normal to the material surface that is placed vertical to the optical axis of the beam, by deflecting the beam using the first deflector supplied with a constant deflecting signal. Therefore, when the incident position of the beam on the material is varied by the second deflector in drawing a desired pattern, defocusing of the beam depends only on the deflection angle of the beam determined by the second deflector. Hence, it is not necessary to take the angle of the material surface to the optical axis 0 into consideration unlike in the prior art system. This greatly facilitates bringing the beam into focus. Furthermore, since the deflectors of two stages are employed to maintain the irradiating beam tilted, the beam can fall on the target material without being affected by deflection chromatic aberrations.

What is claimed is:

1. A doping ion beam implantation lithography system comprising, in sequence, an ion source for generating an ion beam, means for focusing the ion beam emanating from said ion source onto a substrate material to be patterned, and deflecting means for deflecting the beam comprising means to vary the position on the substrate material illuminated by the beam to draw a pattern on the substrate material, an additional deflection means consisting of a deflecting element of a first stage for deflecting the beam in a one direction, a deflecting element of a second stage for deflecting the beam in the opposite direction, and means for coordinating said first and second stages so that the beam is deflected at a constant incident angle that is sufficiently less than 90 degrees to avoid channeling of the implanted ions in surface crevices.

2. A doping ion beam implantation system as set forth in claim 1, wherein each of the deflecting elements of the two stages forming the additional deflecting means consists of an electrostatic deflecting plate that is disposed symmetrically with respect to the optical axis of the system.

3. A doping ion beam implantation system as set forth in claim 1, wherein each of the deflecting elements of the two stages forming the additional deflecting means consists of an electrostatic deflection prism.

* * * * *